United States Patent [19]
Ranganathan et al.

[11] Patent Number: 5,587,672
[45] Date of Patent: Dec. 24, 1996

[54] DYNAMIC LOGIC HAVING POWER-DOWN MODE WITH PERIODIC CLOCK REFRESH FOR A LOW-POWER GRAPHICS CONTROLLER

[75] Inventors: Ravi Ranganathan, Cupertino; Deepraj S. Puar, Sunnyvale, both of Calif.

[73] Assignee: NeoMagic Corp., Santa Clara, Calif.

[21] Appl. No.: 533,647

[22] Filed: Sep. 25, 1995

[51] Int. Cl.$^6$ .................. H03K 19/00; H03K 19/096
[52] U.S. Cl. ............... 326/93; 326/97; 327/198; 327/200
[58] Field of Search ............ 326/93, 98, 96–97; 327/198, 200, 544

[56] References Cited

U.S. PATENT DOCUMENTS

| | | | |
|---|---|---|---|
| 4,250,406 | 2/1981 | Alaspa | 326/98 |
| 4,503,525 | 3/1985 | Malik et al. | 365/222 |
| 4,575,794 | 3/1986 | Veneski | 395/775 |
| 4,686,386 | 8/1987 | Tadao | 327/143 |
| 4,740,721 | 4/1988 | Chung et al. | |
| 4,851,987 | 7/1989 | Day | 364/200 |
| 5,203,003 | 4/1993 | Donner | 395/800 |
| 5,343,096 | 8/1994 | Heikes et al. | |
| 5,537,128 | 7/1996 | Keene et al. | 345/89 |

*Primary Examiner*—Edward P. Westin
*Assistant Examiner*—Jon Santamanro
*Attorney, Agent, or Firm*—Stuart T. Auvinen

[57] ABSTRACT

A controller chip has dynamic logic which is driven by a suspendable clock. Power is reduced in a standby mode when the clock to the dynamic logic is stopped. However, power is still applied to the dynamic logic in standby mode so that the dynamic logic can be quickly resumed without the delay of re-charging the power-supply capacitances in the dynamic logic. Stopping the clock to dynamic logic can eventually cause loss of data. A more severe problem than data loss is power consumption. When the clock is stopped to dynamic logic, the isolated nodes leak and eventually their voltages change. When their voltages change by more than a transistor threshold voltage then both the p-channel and n-channel transistors in dynamic logic cells can turn on, forming a direct current paths between power and ground. Thus power consumption can increase dramatically in suspend mode. The isolated dynamic nodes of the dynamic logic are instead recharged periodically during suspend mode. A timer triggers generation of intermittent clock pulses which are applied to the clock to the dynamic logic, recharging the isolated nodes. When data loss can be tolerated, the intermittent pulses ensure that power consumption does not jump due to the voltage changes on the isolated dynamic nodes.

16 Claims, 6 Drawing Sheets

DYNAMIC LOGIC HAVING POWER-DOWN MODE WITH PERIODIC CLOCK REFRESH FOR A LOW-POWER GRAPHICS CONTROLLER

BACKGROUND OF THE INVENTION—FIELD OF THE INVENTION

This invention relates to dynamic logic, and more particularly for methods to suspend the clock to dynamic logic for power-saving modes.

BACKGROUND OF THE INVENTION—DESCRIPTION OF THE RELATED ART

Logic gates are used to implement a wide variety of systems. Two broad classifications of logic gates can be made: static and dynamic. Static logic does not require that a clock of a minimum frequency be applied while dynamic logic requires a minimum clock frequency. If the clock slows below the minimum frequency, then the dynamic logic can fail to operate properly. Data can be lost by leakage when the clock's frequency falls below the minimum frequency.

Basic Dynamic Logic

Figure 1:
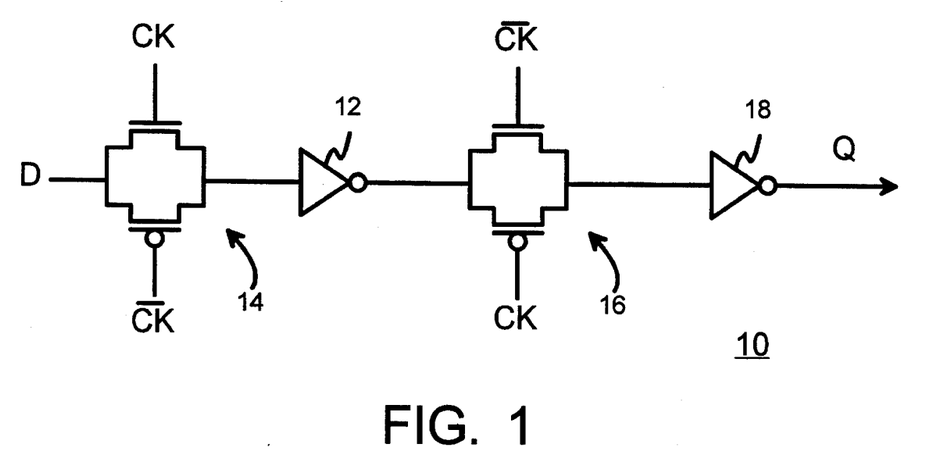
FIG. 1 is a shift register cell using dynamic logic.

FIG. 1 is a shift register cell using dynamic logic. The shift register cell is a dynamic flip-flop 10. Data presented at the D input is presented to the Q output after a rising and a falling edge of clock CK. Inverters 12, 18 are standard CMOS push-pull inverters each having a p-channel MOS transistor with its source connected to power (Vcc or Vdd) and its drain connected to the output, and an n-channel MOS transistor with its source connected to ground and its drain also connected to the output. The inverter's input is connected to the gates of both transistors.

Transmission gates 14, 16 each have an n-channel and a p-channel transistor in parallel, with their gates connected to clock CK and its complement $\overline{CK}$. When clock CK is high and transmission gate 14 is open, transmission gate 16 is closed. Thus feed-through from D to Q is prevented as only one of transmission gates 14, 16 is conducting at any given time. Inverters 12, 18 buffer the output from transmission gates 14, 16 respectively.

Inverters 12, 18 may be replaced with other types of logic gates, such as NAND or NOR gates, or larger networks of these gates may be substituted to perform any desired logic function. The limitation is that the delay through the logic network must be less than the clock CK pulse width so that the set-up time to the next transmission gate is met.

Dynamic logic is typically clocked by a free-running clock of a fixed frequency. As long as this frequency is above a minimum frequency, the dynamic logic operates properly. However, if the frequency is lowered below the minimum frequency, then the data stored may be lost. For example, if clock CK is left in the low state for several seconds, the input to inverter 12 may change. Transmission gate 14 isolates the input to inverter 12 when clock CK is low. The charge on the gates of the n-channel and p-channel transistors in inverter 12 can leak away. Once enough charge has leaked to change the input voltage beyond the input threshold voltage, then the output can change, losing the data.

Static Logic

Figure 2:
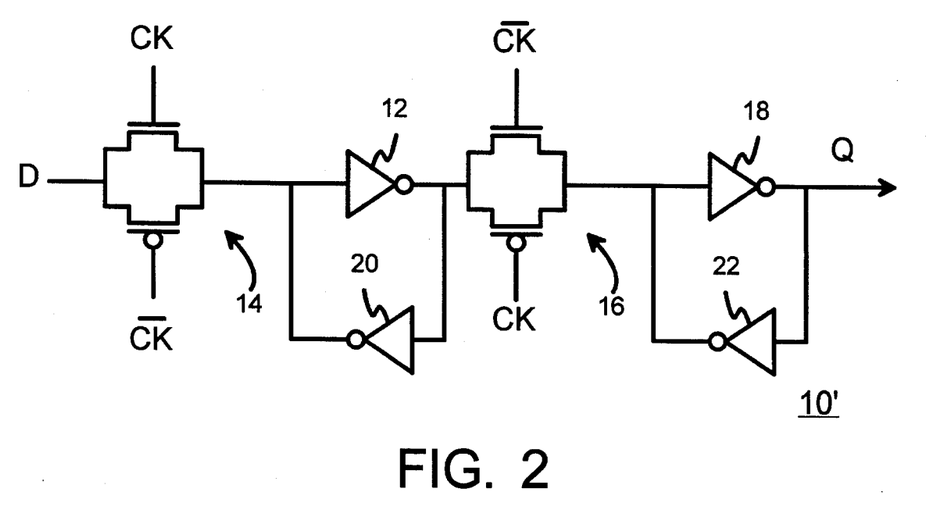
FIG. 2 is a shift register cell using static logic.

The most common solution to the data loss problem of dynamic logic is to use static logic instead. FIG. 2 is a shift register cell using static logic. The shift register cell is a static flip-flop 10'. Feedback inverters 20, 22 ensure that data is not lost when either transmission gate 14, 16 is closed for a long period of time. Small leakage currents on the inputs of inverters 12, 18 are offset by large currents from the outputs (transistor drains) of inverters 20, 22. Otherwise static flip-flop 10' operates in the same fashion as dynamic flip-flop 10.

Static logic is less desirable than dynamic logic for several reasons. Feedback inverters 20, 22 occupy additional silicon area as does their interconnect. When feedback inverters are added to every latch and flip-flop on a large LSI chip, huge numbers of feedback inverters are added. Indeed feedback inverters 20, 22 are 4 of the 12 transistors in static flip-flop 10', or one third of the total number of transistors. Thus the transistor count of a shift register increases by 50% when dynamic cells are replaced with static cells.

Power consumption also increases as the feedback inverters consume active and leakage currents. Inverters 12, 18 and transmission gates 14, 16 may have to be enlarged to drive more current when feedback inverters 20, 22 are added, since feedback inverters 20, 22 drive a small current onto the inputs of inverters 12, 18 which must be overcome by a larger current flowing through transmission gates 14, 16 when the logic state of the cell is flipped. Thus power consumption can increase even more when feedback inverters are added. The design of inverters 12, 18 and transmission gates 14, 16 are constrained by the need to drive more current than feedback inverters 20, 22, and transistor sizes above minimum must often be used even when silicon area is constrained. The larger transistor sizes add more capacitance to upstream nodes and thus slow down the logic.

Thus there are many drawbacks to replacing dynamic logic with static logic. Other solutions have also been disclosed. For example, Heikes et al., U.S. Pat. No. 5,343,096, assigned to Hewlett-Packard of Palo Alto Calif., latches data from dynamic logic into tolerant storage when a slow clock detector determines that the dynamic clock's frequency has fallen below the minimum frequency, thus avoiding data loss. Of course, this requires that the detector and tolerant latches be added, increasing cost.

Power-Saving Mode Stops Clock

Portable computers have created a need for low-power circuits. One method to reduce power consumption is to stop or slow down the clock when the entire computer or a subsystem is idle. Stopping or slowing down the clock can cause data loss if dynamic logic is used. Thus most designs that stop the clock use static logic. Data is retained as long as power is applied, but active power is reduced substantially when the clock is stopped or slowed down.

Donner, in U.S. Pat. No. 5,203,003, assigned to Echelon Corp. of Palo Alto Calif., discloses a computer which uses both static and dynamic components. The static components hold the state of the computer when the clock is suspended to save power. However, again static components must be added with the cost and power drawbacks discussed above.

Dynamic Logic Dissipates Power as Data is Lost

Figure 3:
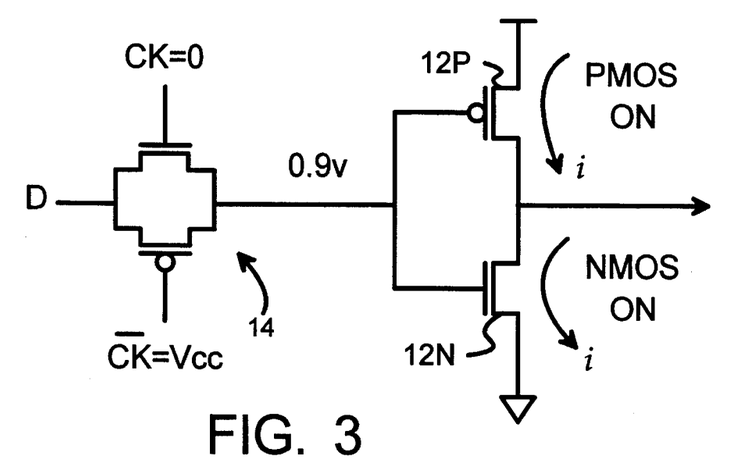
FIG. 3 shows a dynamic-logic inverter when the voltage on an isolated input changes by more than a transistor threshold voltage, forming a direct current path from power to ground.

A special problem occurs when dynamic logic is used in a low-power system. Once the clock is stopped, leakage can cause data loss as the isolated inverter's input voltage changes beyond the input threshold. Even if this data loss can be tolerated, such as when the computer's state is saved to disk or static memory, the power consumption of the dynamic logic increases as the input voltage changes due to leakage. As shown in FIG. 3, when an isolated input of inverter 12 is at zero volts, the p-channel transistor 12P is on, but the n-channel transistor 12N is off in inverter 12. Thus no active power is consumed by the inverter as the n-channel transistor is off, preventing a direct current path between power and ground. However, as leakage occurs and the input voltage rises to the threshold voltage of the n-channel transistor, about 0.8 volts, n-channel transistor 12N turns on and conducts, and a direct current path is made between power and ground. Data may not yet be lost until the leakage raises the input voltage to the switching threshold of the inverter, about 2.5 volts with a 5-volt power supply.

Thus if the clock to the dynamic logic is stopped to save power, power consumption can actually increase as leakage raises input voltages above a transistor threshold, turning on transistors. Power must be cut off to the dynamic logic to prevent this power loss when the clock is stopped. This is undesirable since it may take a long time to ramp the power back up before resuming the clock, as large power-supply capacitances must be charged up.

What is desired is to use dynamic logic in a low-power system that suspends the clock. It is desired to continue to have the power supply applied to the dynamic logic when the clock is suspended so that the clock may be quickly resumed without a delay to charge up the power-supply capacitances.

SUMMARY OF THE INVENTION

A controller chip has dynamic logic which is driven by a suspendable clock. Power is reduced in a standby mode when the clock to the dynamic logic is stopped. However, power is still applied to the dynamic logic in standby mode so that the dynamic logic can be quickly resumed without the delay of re-charging the power-supply capacitances in the dynamic logic.

Stopping the clock to dynamic logic can eventually cause data loss and increased power consumption. When the clock is stopped to dynamic logic, the isolated nodes leak and eventually their voltages change. When their voltages change by more than a transistor threshold voltage then both the p-channel and n-channel transistors in dynamic logic cells can turn on, forming a direct current paths between power and ground. Thus power consumption can increase dramatically in suspend mode.

The isolated dynamic nodes of the dynamic logic are recharged periodically during suspend mode. A timer triggers generation of intermittent clock pulses which are applied to the clock to the dynamic logic, recharging the isolated nodes.

A dynamic logic circuit includes a plurality of dynamic logic cells. Each dynamic logic cell has an output, an input, and isolation means for electrically isolating the input from other dynamic logic cells in response to a clock, and logic means for performing a logic function. The logic means includes a pull-up transistor for connecting the output to a power supply in response to a voltage on the input. The logic means also includes a pull-down transistor for connecting the output to ground in response to a voltage on the input.

A clock generator generates the clock to the isolation means in the plurality of dynamic logic cells. The clock generator has an operating mode clock input which receives an operating mode clock. A pulse generator has a first output and receives a recharging clock pulse when not in an operating mode. The pulse generator includes constant voltage means for outputting to the first output a constant voltage between recharging clock pulses.

A selector means selects as the clock to the plurality of dynamic logic cells the operating mode clock during an operating mode but selects the first output from the pulse generator when not in the operating mode.

Thus the plurality of dynamic logic cells are driven by the operating mode clock during operating mode but receive the recharging clock pulse and constant voltage when not in the operating mode.

In further aspects the invention has a clock synthesizer for generating the operating mode clock. The clock synthesizer generates a continuous stream of periodic clock pulses during the operating mode but does not generate any pulses when not in the operating mode. The clock synthesizer is powered-down when not in the operating mode. In other aspects the invention includes a means for continuously applying power to the plurality of dynamic logic cells during the operating mode and when not in the operating mode.

In still further aspects the pulse generator has a counter for generating a pair of pulses in response to a trigger signal. The trigger signal is generated periodically by a real-time clock circuit. In some aspects of the invention the isolation means comprises a transmission gate has complementary transistors. The plurality of dynamic logic cells comprise a FIFO frame buffer for buffering pixel data from a video memory for display onto a display screen.

When data loss can be tolerated, the intermittent pulses ensure that power consumption does not jump due to the voltage changes on the isolated dynamic nodes. Thus low-power dynamic logic can be implemented including a suspend mode.

DETAILED DESCRIPTION

The present invention relates to an improvement in clocking of dynamic logic. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

OVERVIEW

Dynamic logic is driven by a suspendable clock. During a normal operation mode, the suspendable clock pulses at a full operational frequency. During a suspend mode, the clock's pulsing is suspended. To prevent data loss and high power consumption by the dynamic logic, the suspendable clock is periodically pulsed. A timer triggers a two-pulse burst of the suspendable clock before leakage in the dynamic logic changes the voltage on isolated dynamic nodes by a transistor threshold voltage.

Figure 4:
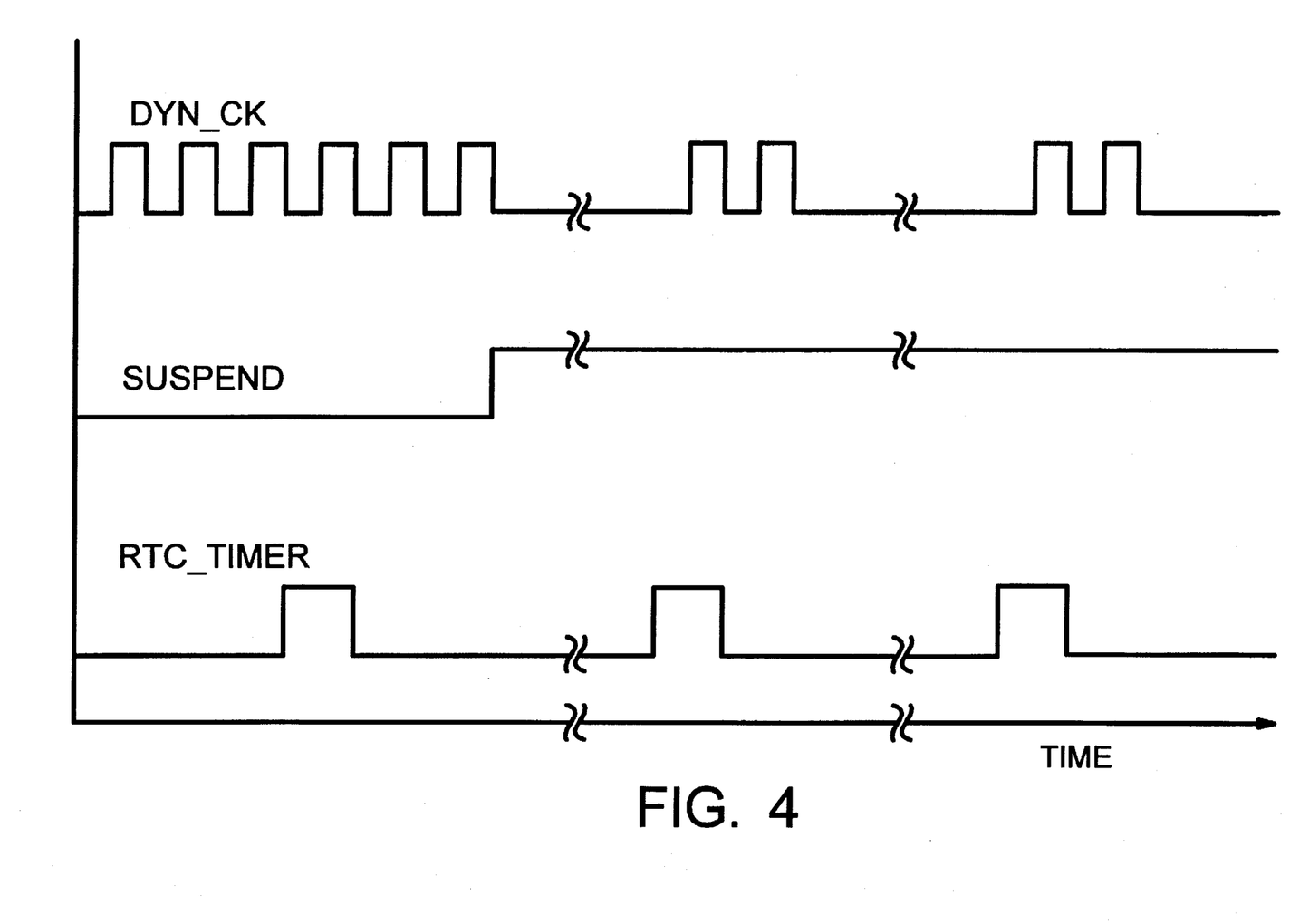
FIG. 4 is a waveform diagram of a suspendable clock.

FIG. 4 is a waveform diagram of a suspendable clock. During normal operating mode the suspend signal is inactive (low) and the suspendable clock operates at full frequency for normal operation. When the suspend signal is activated (high), the suspendable clock is suspended and no longer pulses. The suspendable clock is maintained at ground, 0 volts.

A real-time clock (RTC) periodically outputs a refresh pulse. This refresh pulse is output at or above the minimum frequency for the clock to the dynamic logic. When the refresh pulse occurs during suspend mode, a one-shot circuit outputs a dual pulse of the suspendable clock. The dual pulse ensures that a full high and a full low pulse-width is output to the dynamic logic. Thus the isolated nodes in the dynamic logic have sufficient time to be re-charged to the power supply voltage or to ground.

One-Shot Refresh Pulse Generator and Clock Switching Circuit

Figure 5:
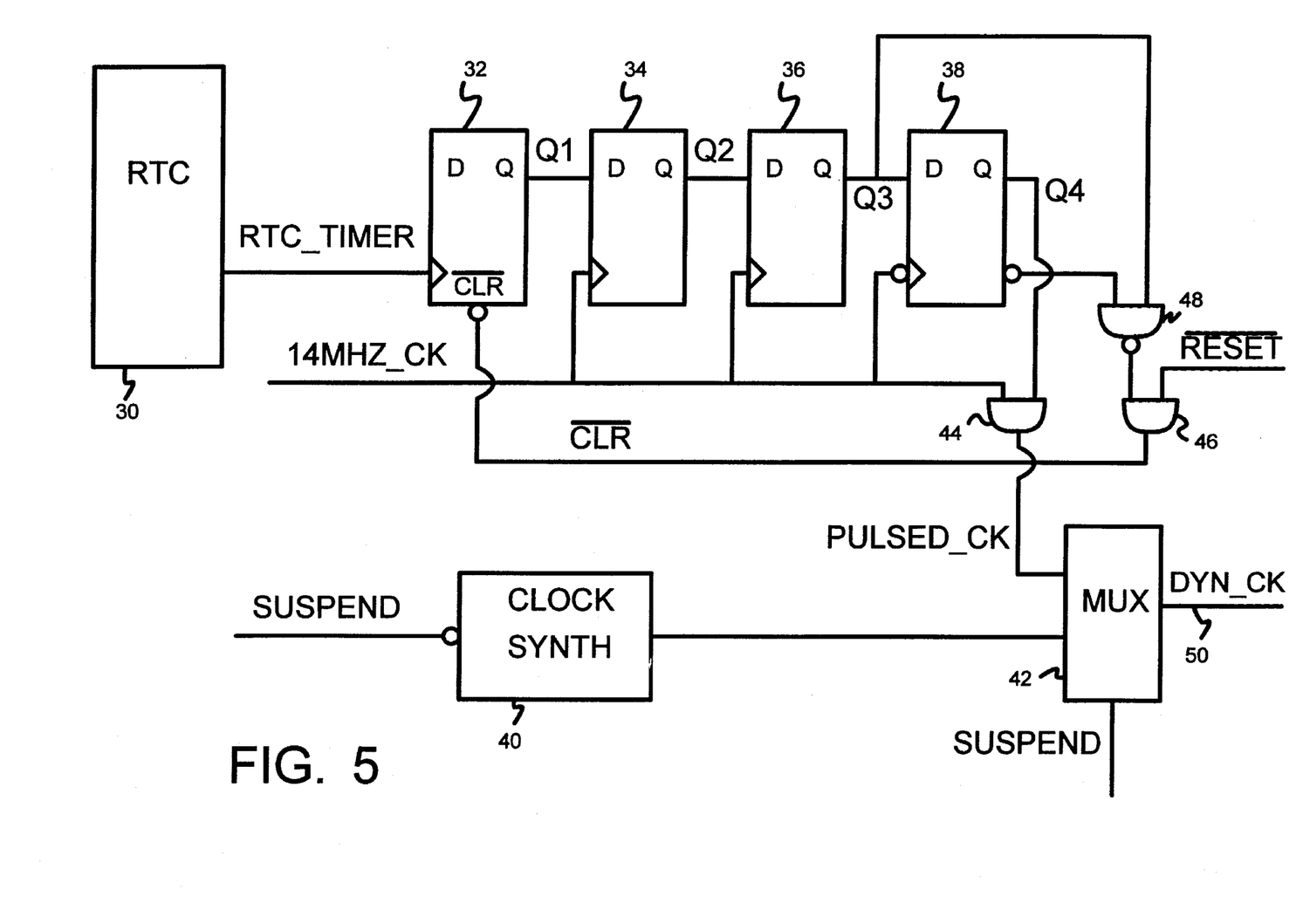
FIG. 5 is a circuit diagram of a one-shot refresh pulse generator and a clock switching circuit which generates the suspendable clock.

FIG. 5 is a circuit diagram of a one-shot refresh pulse generator and a clock switching circuit which generates the suspendable clock. Real-time counter or clock 30 is driven by a free-running 32 KHz oscillator and is used to generate real-time signals every second, minute, hour, etc. These outputs can be used to place the system into suspend mode when little or no activity of a certain type occurs for a predetermined period of time. For example, when no keyboard activity occurs for more than 5 minutes the system might then enter suspend mode.

The real-time-clock timer output from real-time clock 30 has a period of 128 msec. Flip-Flop 32 is clocked by the rising edge of this pulse, setting Q1. On the next rising edge of a 14 MHz clock, the high signal on Q1 is latched to Q2, and on to Q3 on the next rising edge of the 14 MHz clock. On the following falling edge of the 14 MHz clock the high on Q3 is latched to Q4. NAND gate 48 outputs a low when Q3 is high and Q4 is low, which occurs for the first half of the second 14 MHz clock period after the 128 msec pulse. The low output from NAND gate 48 is input to AND gate 46, and clears flip-flop 32. The cleared Q1 is then clocked to Q2, Q3, Q4 of flip-flops 34, 36, 38 on the next two rising edges of the 14 MHz clock and the following falling edge respectively. Flip-flops 32, 34, 36, 38 then wait another 128 msec until the next 128 msec periodic output from real-time clock 30 occurs, when the sequence is repeated.

AND gate 44 gates the 14 MHz clock with Q4. Thus only when Q4 is high is the 14 MHz clock outputted to mux 42. As is shown in FIG. 6, exactly two pulses of the 14 MHz clock are passed through AND gate 44, corresponding to the delay for clearing Q1 and propagating the clear to Q4 through flip-flops 34, 36, 38.

Mux 42 selects this dual-pulse of the 14 MHz clock when suspend mode is active. When suspend mode is disabled the output from clock synthesizer 40 is output of mux 42 to suspendable dynamic clock 50. Dynamic clock 50 is routed to clock dynamic logic circuitry. Clock synthesizer 40 is powered down by the suspend mode signal, further reducing power consumption in suspend mode. Clock synthesizer 40 may output a clock with a higher frequency than the 14 MHz clock, depending upon the operating frequency of the dynamic logic.

Figure 6:
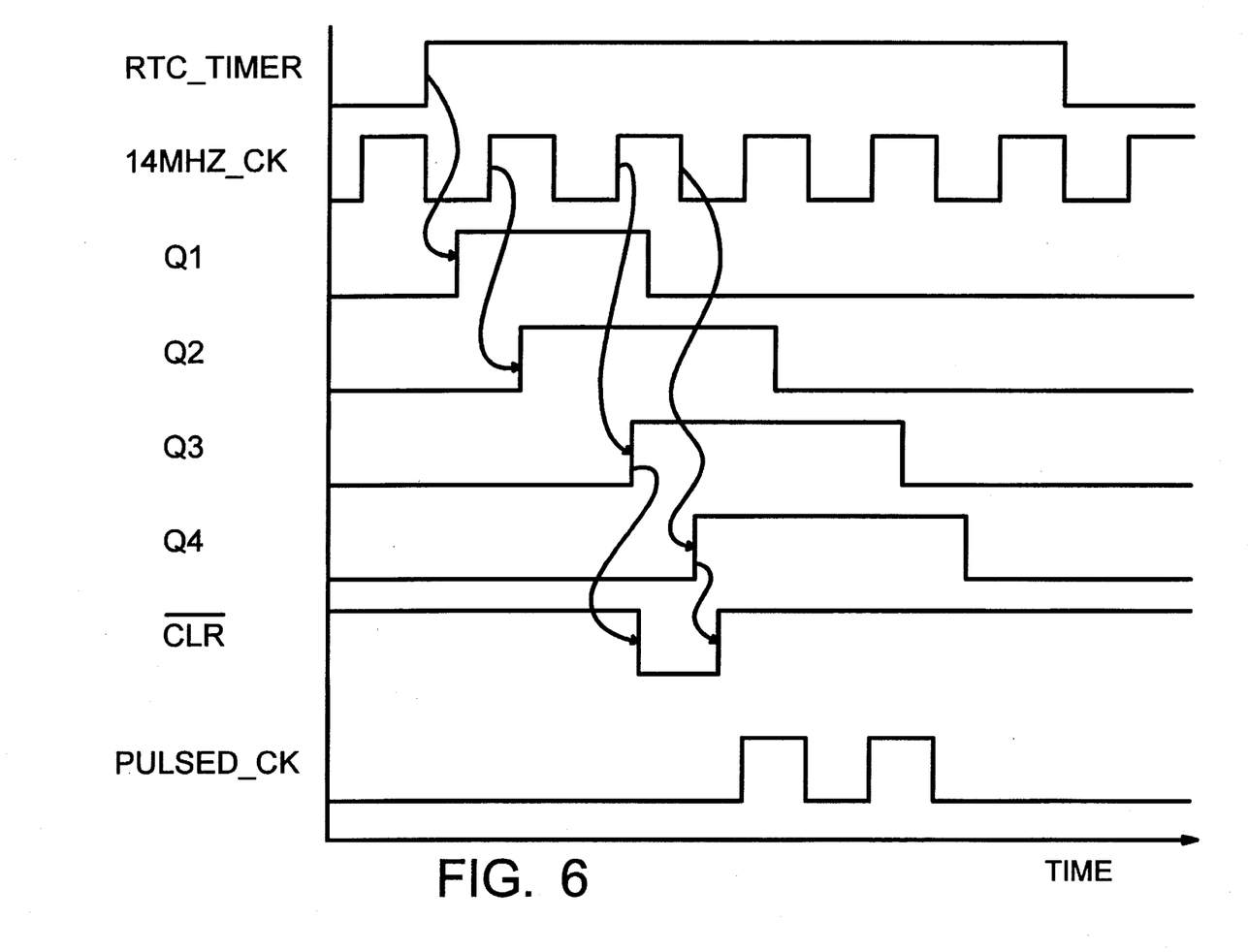
FIG. 6 is a waveform diagram of the operation of the one-shot refresh pulse generator and clock switching circuit of FIG. 5 which generates the suspendable clock for the dynamic logic.

FIG. 6 is a waveform diagram of the operation of the one-shot refresh pulse generator and clock switching circuit of FIG. 5 which generates the suspendable clock for the dynamic logic. When the 128 msec pulse from real-time clock 30 occurs, Q1 is set on the next rising edge of the 14 MHz clock. Q2 and Q3 are set on the following rising edges, while Q4 is set on the next falling edge. When Q3 is high but before Q4 goes high a clear signal is sent to clear Q1. The low on Q1 is then propagated down the chain of flip-flops until Q4 goes low two and a half 14 MHz clock periods later. During the time Q4 is high, the 14 MHz clock is gated out to the dynamic clock. Two complete high-going pulses of the 14 MHz clock are gated out to the dynamic logic. These two pulses are sufficient to recharge the nodes isolated by the dynamic logic.

Figure 7:
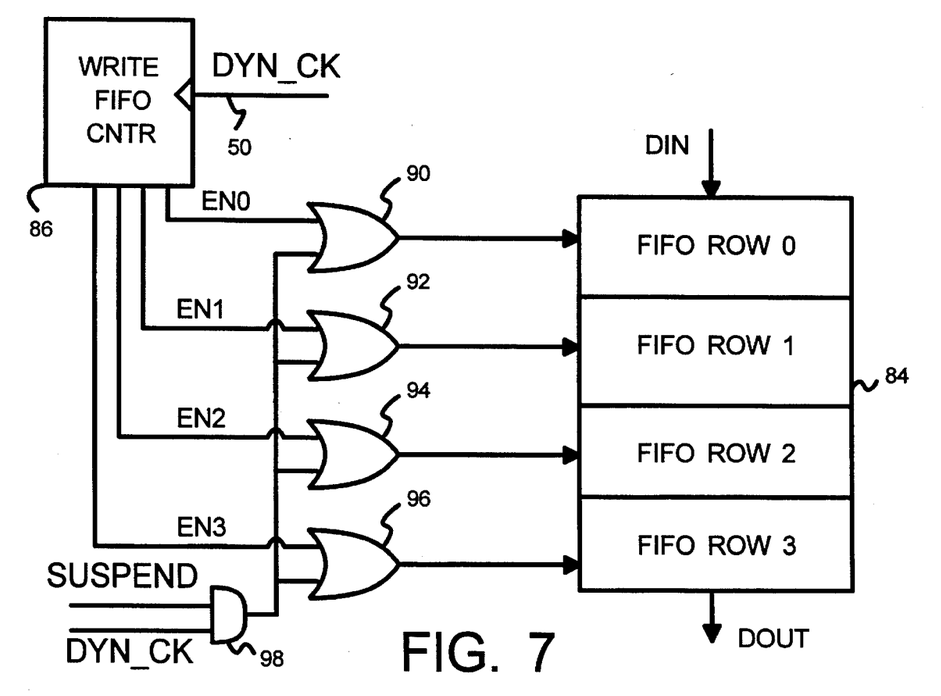
FIG. 7 is a diagram of transparent dynamic latches being driven by the suspendable dynamic clock.

FIG. 7 is a diagram of transparent dynamic latches being driven by the suspendable dynamic clock. While flip-flops can simply receive the suspendable dynamic clock 50 directly as their clock input, transparent latches often have enable circuits that need to have the suspendable clock OR'ed in. A small FIFO array 84 is shown with four rows of dynamic latches. A dynamic latch contains just one transmission gate and one inverter and is sometimes called a transparent latch as the latch's input is connected to its output when the enable input is high. Ring counter 86 selects one of the four dynamic latches to be driven by the FIFO input Din. Another ring counter (not shown) is used to connect one of the dynamic latches to the FIFO's output Dout. The FIFO may be made as wide or as deep as needed by adding more dynamic latch cells and increasing the ring pointer size. Ring counter 86 is clocked by dynamic clock 50 and sequentially activates the four enables EN1, EN2, EN3, EN4.

In normal mode each dynamic latch receives the enable at only one-quarter the clock frequency since each enable is active only on each fourth dynamic clock 50 pulse. For deeper FIFO's each enable is pulsed less frequently. This is a problem for suspend mode since all dynamic latches need to be refreshed with each clock pulse.

OR gates 90, 92, 94, 96 are added to route the dynamic clock 50 directly to each dynamic latch during suspend mode. When suspend mode is active, AND gate 98 routes the dynamic clock 50 to OR gates 90, 92, 94, 96 and then to the dynamic latches in FIFO array 84. Thus al dynamic latches are refreshed at the same time.

Since the clock is pulsed periodically during suspend mode, it is possible that state machines can continue to sequence during suspend mode. This is undesirable as the system is idle and should not sequence. After several hours the state machines could advance and assert or de-assert output or control signals. The inputs to the state machines can be gated off by the suspend mode signal to prevent the state machine from starting. For video controllers, the horizontal dot counter, which clocks pixels across a horizontal line, can be disabled from counting. Since all CRT controls are ultimately generated from the horizontal dot counter, all the CRT logic is halted when the horizontal dot counter is halted. All requests to the memory controller are gated off at the source using the suspend signal. Thus state machines cannot advance out of their idle states.

Application of the Invention to a Video Controller

The invention has particular application to a video display controller. Video controllers have a large amount of logic which transfers pixel data from a display memory to a display screen. The data is transferred through several high-bandwidth FIFO memories. These FIFO memories are often large and clocked at very high rates during operating mode to meet the pixel bandwidth required by the current resolution mode of the monitor. Higher resolutions require that larger numbers of pixels be transferred in a given amount of time. Thus these FIFO's consume much active power. This active power can be reduced by using dynamic logic rather than static logic.

A method to reduce power in such a video controller is disclosed in co-pending application No. 08/285,401 for "Clock Management for Power Reduction in a Video Display Sub-System", which is assigned to the same assignee and has an inventor in common. In this method the clocks to these FIFO's are suspended during times when pixels are not transferred to the display screen, such as during horizontal and vertical re-trace periods. Thus power is reduced, by suspending the clock during these time periods when pixel data transfer is not necessary.

Figure 8:
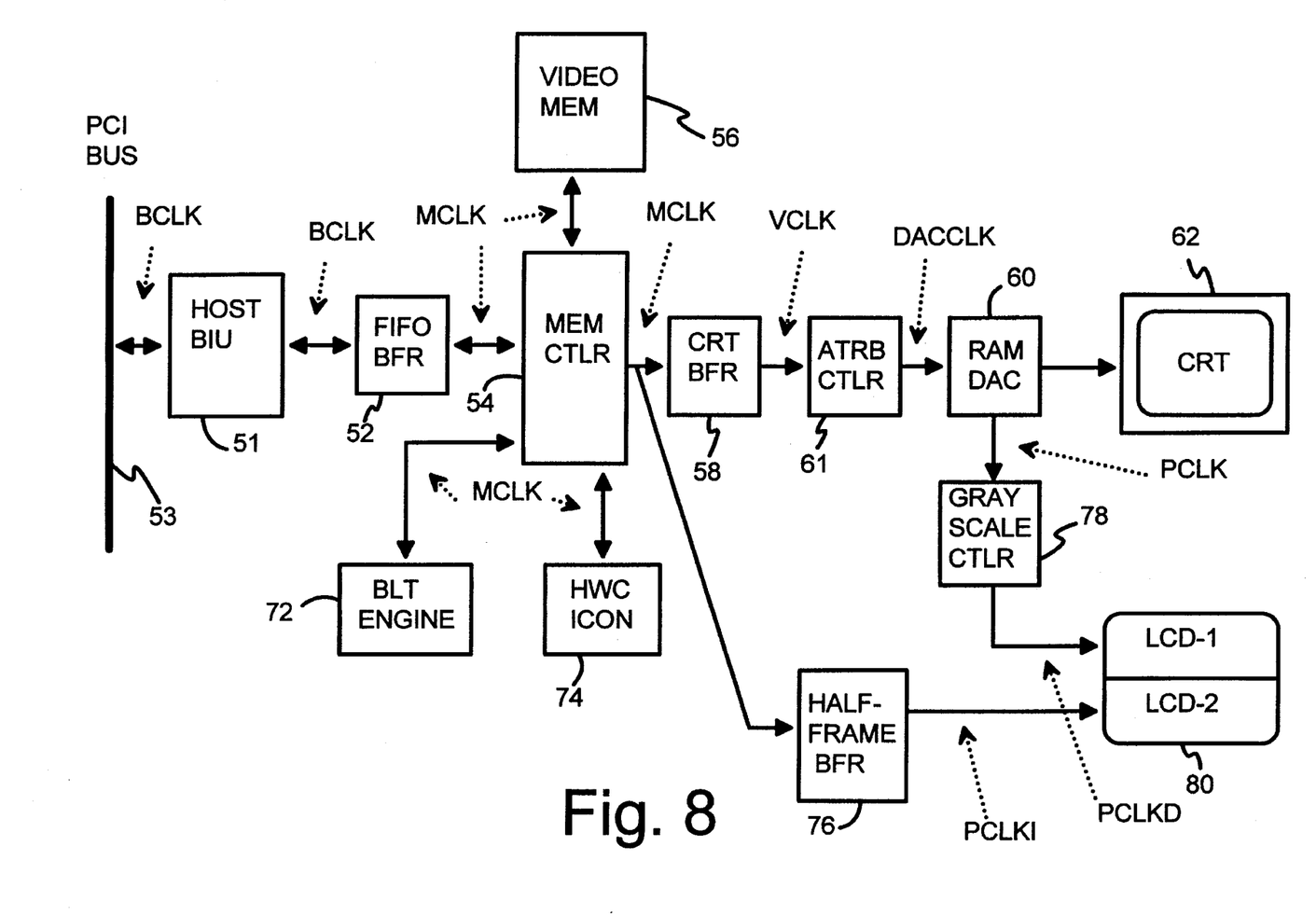
FIG. 8 shows a block diagram of a video sub-system driving a CRT and an LCD.

LCD and CRT Controller—FIG. 8

FIG. 8 shows a block diagram of a video sub-system driving a CRT and an LCD. A host bus such as a PCI bus 53 on the host transfers data to and from host buffer 52 with the aid of host bus-interface unit 51. A PCI bus clock BCLK is provided on the host's PCI bus 53. PCI bus 53 is an industry-standard interface bus defined by a consortium of personal computer manufacturers. The PCI bus writes data to host buffer 52 in rapid "bursts" synchronized to BCLK.

A FIFO synchronous to the host bus clock BCLK, such as host buffer 52, is necessary for supporting higher BCLK frequencies such as 33 MHz. Long bursts from the host can be supported by providing larger FIFO's. However, the larger prior-art FIFO's can consume more power, even when data is not being transferred. The present invention stops the clock to a FIFO such as host buffer 52 except when data is being transferred through the FIFO. A small front-end bus cycle monitor or tracker is always running and enables the clock to the FIFO when a bus cycle is decoded by the cycle tracker for the video controller. Because it is not known in advance if any particular host bus cycle is for the video controller, or for another device, having a free-running cycle tracker allows for a fast response to the cycle, while reducing power because the FIFO is only turned on once the cycle tracker decodes a cycle that loads the FIFO. Zero waits states and power reduction are possible with this approach.

Memory controller 54 uses memory clock MCLK to transfer host data to and from the host buffer 52. Video memory 56 may require periodic refreshing to prevent data loss from leakage in the dynamic memory chips in video memory 56. Block transfers and manipulation of the video data in video memory 56 may be accomplished by BLT engine 72, which itself operates using MCLK. A hardware cursor and icon-drawing logic is provided by HWC logic 74. Memory controller 54 transfers video data to and from HWC logic 74 and video memory 56.

Memory controller 54 also writes pixel data from video memory 56 to CRT buffer 58 for refreshing CRT monitor 62 and/or LCD screen 80. Data may also be written to half-frame buffer 76, which buffers half of the screen when a dual-scan LCD screen is used.

Pixel data is transferred from CRT buffer 58 to attribute controller 61 using the video clock VCLK. Attribute controller 61 may re-map or alter the color represented by the pixel data by using a color look-up table. Other attributes, such as blinking or reverse-video characters may be applied by attribute controller 61.

Using the DACCLK, RAMDAC 60 receives the modified pixel data from attribute controller 61. RAMDAC 60 contains a RAM that is indexed by the pixel data, and outputs digital values for red, green, and blue sub-pixels that comprise a color pixel. RAMDAC 60 also contains a digital-to-analog converter (DAC) that converts the digital color sub-pixels to analog intensity values that are transmitted to the CRT monitor 62. The DACCLK clock is used to cream the analog output to CRT monitor 62 by timing the transfer of the analog pixel intensity data outputted.

Digital pixel data from RAMDAC 60 is clocked to Gray-scale controller 78 by panel clock PCLK. The digital pixel data is taken from RAMDAC 60 after the RAM has been accessed and has output the digital sub-pixels, but before conversion to analog values. Gray-scale controller 78 may perform a gray-scale conversion of the color sub-pixels if LCD screen 80 is monochrome or color, or may perform some other conversion of the pixel data to a format accepted by LCD screen 80. The converted pixel data from Gray-scale controller 78 is clocked into the LCD screen 80 using the direct panel clock, $PCLKt_d$. LCD screen 80 may itself include some additional control or conversion logic to manipulate the pixel data before its is visually displayed on a screen, and it may be of many different types or technologies. When the LCD screen is of the dual-panel type, pixel data is also supplied by an indirect path from half-frame buffer 76, being clocked in by indirect panel clock $PCLK_I$.

Advantages of the Invention

Dynamic logic is used on a low-power system which suspends the clock. Dynamic logic requires less area as feedback inverters are avoided and smaller device sizes can be used since the driving devices do not have to overpower the feedback inverters. Active power is also reduced by using smaller devices while speed may be kept constant or improved.

Since the intermittent periodic refreshing pulses are triggered infrequently, the suspend mode current is greatly reduced. In the example described, the intermittent pulses are triggered every 128 msec, or every 128,000,000 nanoseconds. With the 14 MHz clock, each clock period is about 70 nanoseconds. The dual pulse thus requires about 140 nanoseconds. Since the dual refreshing pulses occur once every 128 msec, the active power is reduced to 140 ns/128,000,000 ns, or 1/250,000 of the full value in operating mode. Thus active power is reduced by five orders of magnitude. Of course, leakage currents reduce the actual power savings achieved, but a power savings of 2, 3, or 4 orders of magnitude is anticipated.

If data loss is not a concern for the system during suspend mode, the dynamic clocks can all be pulsed at the same time when flip-flops are used. Transparent latches cannot use the invention without further modification when data cannot be lost. The intermittent clock pulsing is used just to re-charge the isolated dynamic nodes to prevent active power drain from gates above the transistor threshold voltage.

Alternate Embodiments

Several other embodiments are contemplated by the inventors. For example a 14 MHz clock has been described for clocking the flip-flops which generate the suspendable clock. The 14 MHz clock is commonly available for other system functions. However, other frequencies could easily be substituted.

Suspend mode is referred to by a variety of terms, such as standby or power-down mode, depending upon the manufacturer. Suspend mode as described herein is when the clock is stopped but the power supply is left connected to the dynamic logic. The various blocks of the video sub-system may be integrated onto one or more silicon substrates, depending upon the technology used. The invention has been described in terms of a combined low-power CRT and LCD controller, but the invention could apply to desktop computers with only CRT that are designed to be energy-efficient. The invention could also be used for LCD-only systems, as stopping the memory and bus clocks except when needed can significantly reduce power consumption when the display sub-system is active.

The preferred embodiment used the PCI bus, but other host busses such as VESA, EISA, or ISA (AT) may be used. Many implementations of the logic disclosed herein is possible. For instance, a circuit has been shown using a positive-logic AND gate, but a positive-logic OR gate could be used with an input signal inverted. Inverting logic using NAND or NOR gates could likewise be used, and many combinations of more complex logic is possible.

Additionally, each of the clocks may be enabled or pulsed in a staggered or pipelined fashion, when the pixel data is being transferred through the particular logic blocks controlled by that clock. For example, the panel clock PCLK may be enabled a few clock cycles after VCLK is enabled, and may be disabled a few clock cycles after VCLK is disabled, to account for the pipeline delays of the data in reaching the LCD controller from the CRT buffer.

The invention has been described as generating a dual pulse for refreshing the dynamic logic. This provides both a full high-going and a full low-going pulse-width. However, a single pulse may also be used for some embodiments, or additional pulses may be used. By including more stages of flip-flops for the pulse generator of FIG. 5, more than two pulses may be generated.

For transparent latches, of the dynamic clock is not needed if the clock is stopped in a state that leaves the latches transparent or open. In that case, the dynamic clock input to AND gate 98 of FIG. 7 is not used, and AND gate 98 may be deleted. However, edge-triggered flip-flops require pulsing of the dynamic clock. Additional clock-switching logic may be added to switch the clock synchronously and avoid glitches and runt or shortened pulses when entering or exiting suspend mode.

In addition to the host-to-controller FIFO 52 and the CRT buffer FIFO 58 of FIG. 8, other FIFO buffers may exist and be powered-down according to the invention. For example, a video-camera may have direct access to video memory 56 and/or memory controller 54. One such video-camera port is known as the zoomed video port ("ZV" port). An additional ZV FIFO buffer may buffer data to video memory 56 or memory controller 54. A second FIFO may be added in parallel with CRT buffer 58 to buffer video data. Each of these FIFO buffers can be suspended with the intermittent suspendable dynamic clock. Additional FIFO's may be used to buffer video (YUV) data for scaling and color-space conversion. Thus more advanced graphics applications tend to have more FIFO buffers, and can benefit from the invention.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A dynamic logic circuit comprising:
   a plurality of dynamic logic cells, each dynamic logic cell having:
   an output;
   an input;
   isolation means for electrically isolating the input from other dynamic logic cells in response to a clock;
   logic means for performing a logic function, the logic means including a pull-up transistor for connecting the output to a power supply in response to a voltage on the input, the logic means also including a pull-down transistor for connecting the output to ground in response to a voltage on the input;
   a clock generator for generating the clock to the isolation means in the plurality of dynamic logic cells, the clock generator comprising:
   an operating mode clock input for receiving an operating mode clock;
   a pulse generator for generating a first output, the first output receiving a recharging clock pulse when not in an operating mode, the pulse generator including constant voltage means for outputting to the first output a constant voltage between recharging clock pulses;
   selector means for selecting as the clock to the plurality of dynamic logic cells the operating mode clock during an operating mode but selecting the first output from the pulse generator when not in the operating mode,
   a clock synthesizer for generating the operating mode clock, the clock synthesizer generating a continuous stream of periodic clock pulses during the operating mode but not generating any pulses when not in the operating mode, the clock synthesizer being powered-down when not in the operating mode,
   whereby the plurality of dynamic logic cells are driven by the operating mode clock during operating mode but receive the recharging clock pulse and constant voltage when not in the operating mode.

2. The dynamic logic circuit of claim 1 further comprising means for continuously applying power to the plurality of dynamic logic cells during the operating mode and when not in the operating mode.

3. The dynamic logic circuit of claim 1 wherein the isolation means comprises a transmission gate having complementary transistors.

4. The dynamic logic circuit of claim 3 wherein the plurality of dynamic logic cells comprise a shift register.

5. The dynamic logic circuit of claim 4 wherein the plurality of dynamic logic cells comprise a FIFO frame buffer for buffering pixel data from a video memory for display onto a display screen.

6. A dynamic logic circuit comprising:

a plurality of dynamic logic cells, dynamic cell having:
an output;
an input;
isolation means for electrically isolating the input from other dynamic cells in response to a clock;
logic means for performing a logic function, the logic means including a pull-up transistor for connecting the output to a power suppy in response to a voltage on the input, the logic means also including a pull-down transistor for connecting the output to ground in response to a voltage on the input;

a clock generator for generating the clock to the isolation means in the plurality of dynamic logic cells, the clock generator comprising:
an operating mode clock input for receiving an operating mode clock;
a pulse generator for generating a first output, the first output receiving a recharging clock pulse when not in an operating mode, the pulse generator including constant voltage means for outputting to the first output a constant voltage between recharging clock pulses wherein the pulse generator comprises a counter for generating a pair of pulses in response to a trigger signal;
selector means for selecting as the clock to the plurality of dynamic logic cells the operating mode clock during an operating mode but selecting the first output from the pulse generator when not in the operating mode;

whereby the plurality of dynamic logic cells are driven by the operating mode clock during operating mode but receive the recharging clock pulse and constant voltage when not in the operating mode.

7. The dynamic logic circuit of claim 6 wherein the trigger signal is senerated periodically by a real-time clock circuit.

8. A dynamic logic circuit comprising:

a plurality of dynamic logic cells, each dynamic logic cell having:
an output;
an input;
isolation means for electrically isolating the input from other dynamic logic cells in response to a cock;
logic means for performing a logic function, the logic means including a pull-up transistor for connecting the output to a power supply in response to a voltage on the input, the logic means also including a pull-down transistor for connecting the output to ground in response to a voltage on the input;

wherein the plurality of dynamic logic cells comprise a FIFO frame buffer for buffering pixel data from a video memory for display onto a display screen;

a clock generator for generating the clock to the isolation means in the plurality of dynamic logic cells, the clock generator comprising:
an operating mode clock input for receiving an operating mode clock;
a pulse generator for generating a first output, the first output receiving a recharging clock pulse when not in an operating mode, the pulse generator including constant voltage means for outputting to the first output a constant voltage between recharging clock pulses;
selector means for selecting as the clock to the plurality of dynamic logic cells the operating mode clock during an operating mode but selecting the first output from the pulse generator when not in the operating mode;

a horizontal dot counter for indicating a position in a horizontal line on a screen of a pixel of data transferred to the screen, the horizontal dot counter sequencing as pixels are transferred to the horizontal line on the screen; and means for halting sequencing of the horizontal dot counter, whereby the plurality of dynamic logic cells are driven by the operating mode clock during operating mode but receive the recharging clock pulse and constant voltage when not in the operating mode whereby the horizontal dot counter is prevented from sequencing when not in the operating mode even when intermittent pulses are applied.

9. The dynamic logic circuit of claim 8 wherein the constant voltage is selected from the group consisting of a power-supply voltage and ground.

10. A method of operating a semiconductor device comprising:

applying a suspendable clock to dynamic logic, the suspendable clock isolating inputs to the dynamic logic during a portion of a period of the suspendable clock, the dynamic logic driving an output node high with a p-channel transistor and low with an n-channel transistor in response to a voltage on an input node to the dynamic logic;

driving the suspendable, clock with a continuous train of pulses during a normal operating mode, the dynamic logic drawing active current during the normal operating mode;

driving the suspendable clock with intermittent pulses during a suspend mode, the intermittent pulses connecting isolated inputs of the dynamic logic to a drain of a MOS transistor for recharging the isolated inputs to the dynamic logic, the dynamic logic drawing a leakage current significantly lower than the active current during the suspend mode;

driving the suspendable clock with a constant voltage during a first period of time between the intermittent pulses, the first period of time being significantly longer than a second period of time when the intermittent pulses are applied to the suspendable clock;

continuing to apply power to the dynamic logic during the suspend mode as well as the normal operating mode; and generating a periodic trigger signal for-triggering generation of the intermittent pulses, the suspendable clock being driven by the constant voltage after the intermittent pulses but before a next periodic trigger signal, whereby power supply capacitances do not have to be re-charged when the suspendable clock is resumed and whereby the suspendable clock is driven with intermittent pulses during the suspend mode, reducing active current.

11. The method of claim 10 wherein the periodic trigger signal is generated at a frequency greater than a minimum frequency of the dynamic logic, the minimum frequency being a minimum frequency below which a current drawn by the dynamic logic is an active current rather than the leakage current.

12. The method of claim 10 wherein the periodic trigger signal is generated at a frequency greater than a minimum frequency of the dynamic logic, the minimum frequency being a minimum frequency below which data is lost which is stored on isolated nodes of the dynamic logic.

13. The method of claim 10 wherein the minimum frequency being a minimum frequency below which the leakage current changes the voltage on the input nodes of the dynamic logic by substantially a transistor threshold voltage.

14. The method of claim 10 further comprising the step of: coupling the intermittent pulses of the suspendable clock to a transmission gate, the transmission gate connecting the isolated inputs of the dynamic logic to a drain of a MOS transistor for recharging the isolated inputs to the dynamic logic in response to the intermittent pulses.

15. The method of claim 14 wherein the drain of a MOS transistor which recharges the isolated inputs to the dynamic logic comprises an output of an upstream stage of dynamic logic.

16. The method of claim 16 wherein the input node to the dynamic logic is coupled to an isolated gate of the p-channel transistor and an isolated gate of the n-channel transistor in the dynamic logic.

* * * * *